United States Patent
Fuss et al.

(10) Patent No.: US 6,808,858 B2
(45) Date of Patent: Oct. 26, 2004

(54) USE OF CARBOXYL GROUP-CONTAINING ACETAL POLYMERS IN LIGHT-SENSITIVE COMPOSITIONS AND LITHOGRAPHIC PRINTING PLATES

(75) Inventors: Robert Fuss, Liederbach (DE); Harald Baumann, Osterode (DE); Udo Dwars, Herzberg (DE); Hans-Joachim Timpe, Osterode (DE)

(73) Assignee: Kodak Polychrome Graphics LLC, Norwalk, CT (US)

( * ) Notice: Subject to any disclaimer, the term of this patent is extended or adjusted under 35 U.S.C. 154(b) by 0 days.

(21) Appl. No.: 10/221,117

(22) PCT Filed: Mar. 7, 2001

(86) PCT No.: PCT/EP01/02543

§ 371 (c)(1),
(2), (4) Date: Dec. 10, 2002

(87) PCT Pub. No.: WO01/67179

PCT Pub. Date: Sep. 13, 2001

(65) Prior Publication Data

US 2003/0180654 A1 Sep. 25, 2003

(30) Foreign Application Priority Data

Mar. 9, 2000 (DE) .......................................... 100 11 096

(51) Int. Cl.⁷ ............................. G03F 7/021; G03F 7/30
(52) U.S. Cl. ........................ 430/157; 430/175; 430/176; 430/302
(58) Field of Search ................................. 430/157, 175, 430/176, 302

(56) References Cited

U.S. PATENT DOCUMENTS

| | | | |
|---|---|---|---|
| 2,179,051 A | 11/1939 | Morrison et al. | ............. 525/61 |
| 4,065,524 A | * 12/1977 | Laridon et al. | ............... 522/57 |
| 4,355,096 A | 10/1982 | Walls | ......................... 430/302 |
| 4,472,494 A | * 9/1984 | Hallman et al. | ............ 430/160 |
| 4,665,124 A | * 5/1987 | Walls et al. | .................. 525/61 |
| 4,940,646 A | * 7/1990 | Pawlowski | .................. 430/175 |
| 5,169,897 A | 12/1992 | Walls | ......................... 525/61 |
| 5,534,381 A | * 7/1996 | Ali et al. | .................... 430/156 |
| 6,596,456 B2 | * 7/2003 | Baumann et al. | ........... 430/175 |

FOREIGN PATENT DOCUMENTS

| | | |
|---|---|---|
| DE | 1 447 957 | 4/1965 |
| DE | 2 053 363 | 10/1970 |
| DE | 2 053 364 | 10/1970 |
| DE | 2 245 433 | 9/1972 |
| DE | 23 38 025 C2 | 8/1978 |
| EP | 0 048 876 A1 | 9/1981 |
| EP | 0 104 863 B1 | 9/1983 |
| EP | 0 152 819 A1 | 1/1985 |
| EP | 0 208 145 A2 | 6/1986 |
| EP | 0 211 391 A2 | 7/1986 |
| EP | 0 216 083 A1 | 7/1986 |
| EP | 0 274 075 A3 | 12/1987 |
| EP | 0 752 430 A2 | 7/1996 |
| EP | 0 838 478 A1 | 10/1997 |
| GB | 1396355 | 9/1972 |
| JP | 63-123858 | 5/1988 |
| WO | 93/03068 | 7/1992 |

OTHER PUBLICATIONS

Chemical Aspects of Offset Printing; Baumann, Harald and Timpe, Hans–Joachim; Nov. 12, 1993; pp. 377–389; Journal für praktische Chemie Chemiker–Zeitung; 1994.

* cited by examiner

Primary Examiner—John S. Chu
(74) Attorney, Agent, or Firm—Faegre & Benson LLP

(57) ABSTRACT

The present invention relates to a light-sensitive composition containing: (i) at least one diazonium polycondensation product or at least one system that can be radically polymerized and consists of photoinitiators and unsaturated compounds which can be radically polymerized or at least one hybrid system consisting of a diazonium polycondensation product and a system that can be radically polymerized and consists of photo initiators and unsaturated compounds which can be radically polymerized, (ii) at least one binding agent and optionally one or more exposure indicators, one or more dyes for increasing the image contrast and one or more acids for stabilizing the light-sensitive composition which is characterized in that the binding agent essentially consists of units (A, B, C, D), whereby A corresponds to formula (I), B corresponds to formula (II), C corresponds to formula (III) and D corresponds to formula (IV). The invention also relates to the use thereof for coating printing plates. The invention further relates to printing plates which are coated with said light-sensitive composition.

13 Claims, No Drawings ns stages as possible and which is commercially useful and which gives photosensitive layers having improved properties with regard to press life, developability, sensitivity to press room chemicals and photosensitivity.

USE OF CARBOXYL GROUP-CONTAINING ACETAL POLYMERS IN LIGHT-SENSITIVE COMPOSITIONS AND LITHOGRAPHIC PRINTING PLATES

DESCRIPTION OF INVENTION

Use of acetal polymers containing carboxyl groups in photosensitive compositions and lithographic printing plates The present invention relates to binders and photosensitive compositions which are suitable for the production of printing plates.

Photosensitive compositions which are used in particular for high-performance printing plates now have to meet high requirements.

Essentially two approaches are adopted for improving the properties of photosensitive compositions and hence also of the corresponding printing plates. One is concerned with improving the properties of the photosensitive components in the mixtures (negative diazo resins, photoinitiators, photopolymers etc.), while the other is concerned with finding novel polymeric compounds ("binders") which are intended to control the physical and the mechanical properties of the photosensitive layers. Particularly the latter approach is of considerable importance for printing plates since the behavior in the development and printing process, such as, for example, developability, ink acceptance, scratch resistance and press life, is decisively influenced by the polymeric binders. The shelf-life and the photosensitivity of the materials are also influenced by such polymeric compounds.

In order to meet the extensive requirements, the polymeric binders have various structural elements which can affect individual properties differently. Thus, hydrophilic structural elements, such as for example carboxyl groups and hydroxyl groups, generally promote good developability of the photosensitive compositions in aqueous alkaline developers and in some cases ensure sufficient adhesion to polar substrates. Hydrophobic structural elements, on the other hand, complicate developability in said developers but ensure the good acceptance of the inks in the printing process, which is absolutely essential for printing plates.

Because of the wide range of requirements which the polymeric binders have to meet, there has been extensive work for many years on synthesizing, and optimizing the use of, these substances for photosensitive compositions (cf. for example H. Baumann and H.-J. Timpe: "Chemical Aspects of Offset Printing" in J. prakt. Chem. Chemiker-Zeitung 336 (1994), pages 377–389). It was found that polymers which contain vinyl alcohol groups and acetal groups are particularly suitable.

First, acetal polymers of aliphatic aldehydes having an unsubstituted lower alkyl group and vinyl alcohol/vinyl acetate copolymers were described (U.S. Pat. No. 2,179,051, EP-A-0 216 083 and DE-A-14 47 957). However, such binders give rise to problems during the development of printing plates because the proportion of hydrophilic groups in the polymer is too low. If, however, the degree of acetalation is chosen to be low in the case of these polymers, in order to realize sufficient developability through a high proportion of vinyl alcohol, the press life is too short.

In order to achieve an improvement, partly acetalated vinyl alcohol/vinyl acetate copolymers were provided with hydrophilic or alkali-soluble groups by special reactions. In DE-A-36 44 162 and EP-A-0 274 075, aldehydes containing hydroxyl groups are used in addition to aldehydes having hydrophobic groups (e.g. alkyl or aryl groups) for the acetalation. However, this structural change does not lead to a substantial improvement in the developability or the press life.

In DE-A-20 53 363, DE-A-20 53 364 and EP-A-0 048 876, sulfonylurethane groups were introduced into the polyvinyl acetals in order to improve the developability. However, the low acidity of these groups requires developers having a high solvent content. Moreover, micro elements of printing plates produced in this manner have very little adhesion so that they are removed too rapidly by abrasion in the printing process.

DE-A-22 45 433 describes binders which can be prepared by acetalation of saponified copolymers of vinyl acetate and a monomer carrying carboxyl groups, such as crotonic acid or acrylic acid. For the acetalation, aromatic aldehydes are disclosed. However, this type of binder leads to systems having low photosensitivity, poor developability and a short press life when used for printing plates.

In EP-A-0 211 391 and EP-A-0 152 819, the carboxyl groups are introduced by reacting separately prepared acetals of aliphatic aldehydes with polyvinyl alcohol with intramolecular, cyclic anhydrides of dicarboxylic acids. However, the necessary cost of the synthesis is considerable since, in addition to the acetalation, there is the reaction with the anhydrides, which is possible only in aprotic solvents. Furthermore, the photosensitivity of the mixtures prepared from these binders is still too low.

EP-A-0 208 145 describes binders which are prepared in a three-stage synthesis starting from polyvinyl alcohol: acetalation with aliphatic aldehydes, reaction with intramolecular, cyclic anhydrides of dicarboxylic acids and partial esterification of the carboxyl groups with substituted alkyl halides. In spite of the high cost for the binder synthesis, an improvement of the photosensitivity of the layers produced therefrom is desirable.

The cost of the multistage syntheses can be avoided if, as described in WO 93/03068 and U.S. Pat. No. 5,169,897, polyvinyl alcohol is reacted with aliphatic aldehydes and aliphatic aldehydes containing carboxyl groups or aromatic aldehydes containing carboxyl groups. However, the photosensitive mixtures prepared therefrom have an unfavorable relationship with regard to developability and sensitivity. Moreover, the aldehydes containing carboxyl groups give rise to high costs.

EP-A-0 752 430 describes acetal polymers which can be prepared by reacting polyvinyl alcohol with aliphatic aldehydes and aldehydes having a —X—N(R1)CO—Y—COOH side group. The cost for the preparation of such polymers is however high since the special aldehydes are very expensive, the use of organic solvents cannot be dispensed with in the synthesis and a precipitation step using a nonsolvent is required for isolating the binders.

In spite of this intensive research in the area of photosensitive compositions for printing plates, improvements appear to be desirable in the case of all existing compositions, in particular with regard to their developability and the sensitivity to press room chemicals. Furthermore, either many of the compositions have a large number of components, some of which are expensive, or the preparation of their main components is associated with a high synthesis cost, both of which prevent commercial use.

It was therefore the object of the present invention to provide photosensitive compositions which are used in the production of printing plates, containing a binder whose preparation manages with as small a number of synthesis steps as possible compared with the binders described in the prior art, and which nevertheless has the same physical properties, or physical properties improved in individual areas, in photosensitive compositions. In particular, improved acceptance of the printing ink and/or a longer press life of the corresponding printing plates is to be achieved in comparison with the compositions described in the prior art, while retaining the good developability in developers which contain only small amounts of organic solvents, salts and wetting agents, the high photosensitivities and the good image resolutions, and the compositions should moreover be compatible with the other products used in the processing of printing plates.

This object is achieved by a photosensitive composition comprising:

(i) at least one, preferably one, diazonium polycondensate or at least one, preferably one, system capable of free radical polymerization and comprising photoinitiators and unsaturated compounds which are capable of free radical polymerization or at least one, preferably one, hybrid system comprising a diazonium polycondensate and a system capable of free radical polymerization and comprising photoinitiators and unsaturated compounds which are capable of free radical polymerization, (ii) at least one, preferably one, binder and optionally, one or more exposure indicators, one or more dyes for increasing the image contrast and one or more acids for stabilizing the photosensitive composition, characterized in that the binder essentially, preferably exclusively, comprises units A, B, C and D, A being present in an amount of from 0.1 to 25 mol %, preferably from 1 to 18 mol %, and corresponding to the formula

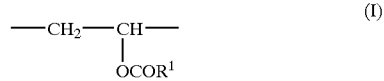

in which $R^1$ is a hydrogen atom, an aliphatic hydrocarbon radical having 1 to 4 carbon atoms which may be unsubstituted or substituted with at least one carboxyl group, sulfonic acid group, hydroxyl group or at least one halogen atom, or an aromatic radical which may be unsubstituted or substituted with at least one alkyl group, carboxyl group, sulfonic acid group, hydroxyl group or at least one halogen atom, preferably a methyl group, B being present in an amount of from 0.1 to 60 mol %, preferably from 20 to 55 mol %, and corresponding to the formula

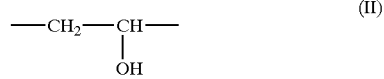

C being present in an amount of from 10 to 80 mol %, preferably from 25 to 65 mol %, and corresponding to the formula

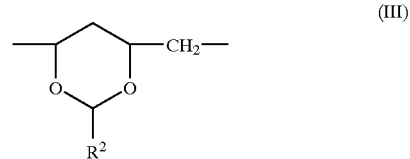

in which $R^2$ is a hydrogen atom, an alkyl radical having from 1 to 10 carbon atoms which may be unsubstituted or substituted with at least one carboxyl group, sulfonic acid group, hydroxyl group or at least one halogen atom, preferably a methyl, ethyl or propyl group, or an aryl group which may be unsubstituted or substituted with at least one alkyl group, carboxyl group, sulfonic acid group, hydroxyl group or at least one halogen atom, it being possible for this unit to be present several times with different radicals $R^2$ independently of one another, and D being present in an amount of from 1 to 20 mol %, preferably from 2 to 8 mol %, and corresponding to the formula

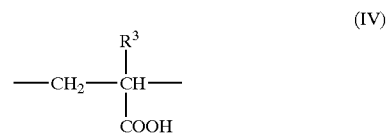

in which $R^3$ is a hydrogen atom or alkyl radical having 1 to 10 carbon atoms, which may be unsubstituted or substituted by a carboxyl group, $R^3$ preferably being a hydrogen atom, a methyl group or —CH$_2$COOH group.

The advantages of the invention are to be seen in the fact that binders for photosensitive compositions can be prepared by very simple syntheses starting from economical, industrially available copolymers. The properties of the binders thus obtainable can be very exactly tailored by varying the molar mass and the degree of saponification of the starting copolymers, as well as the type of substituents $R^1$ to $R^3$.

It is thus possible to obtain tailor-made polymers which are suitable for use in photosensitive compositions based on different photocrosslinking mechanisms. The developability of such mixtures using conventional developers, in particular those which are used in the processing of offset printing plates, can be substantially improved without any ink acceptance problems occurring. Moreover, such compositions are very abrasion-resistant after the usual processing steps for the production of an offset printing plate, so that the printing plates can be used for print runs of more than 300,000 revolutions.

The first essential component of the photosensitive composition according to the invention is a polyvinyl alcohol which contains a carboxyl group bonded directly to the main chain and some of whose OH groups are acetalated.

The preparation of such binders is simple. Copolymers of vinyl alcohol, a vinyl ester and an olefinically unsaturated carboxylic acid serve as starting material.

Suitable vinyl ester components are those which are derived from C$_1$–C$_4$-carboxylic acids. Vinyl acetate is particularly preferred.

The unsaturated carboxylic acid may be unsubstituted at the α olefinic carbon atom or may carry an alkyl radical $R^3$ having up to 10 carbon atoms, which is optionally substituted by a further carboxyl group. Straight-chain or branched alkyl radicals are suitable, methyl groups being particularly preferred. Preferred carboxylic acids are acrylic acid and methacrylic acid.

The acetal radicals $R^2$ can be introduced into the polymer molecule starting from aldehydes $R^2$CHO, cyclic trimers of aldehydes (e.g. paraldehyde), oligomeric aldehydes, (e.g. paraformaldehyde), or acetals of aldehydes $R^2$CH(OR$^4$)$_2$, in which $R^4$ is an alkyl radical. The radical $R^2$ is preferably a branched or straight-chain alkyl radical having 1 to 10 carbon atoms. The synthesis starting from acetaldehyde, propionaldehyde and butyraldehyde or acetals thereof with lower alcohols $R^4$OH is particularly preferred. The acetal radicals $R^2$ within a binder may be different. As a result, the developability can be tailored exactly to the corresponding system. In general, the developability improves if the number of carbon atoms in $R^2$ decreases. On the other hand, the ink acceptance is better in the case of longer-chain radicals. A preferred combination is acetaldehyde and butyraldehyde.

The preparation of the acetal polymers can be carried out by known processes in the presence of catalytic amounts of acid, as disclosed, for example, in EP-A-0 216 083 and DE-C-28 38 025. Preferred acids are hydrochloric acid, phosphoric acid, or organic sulfonic acids.

The reaction is preferably carried out at temperatures of from 0 to 90° C. in a solvent for the starting polymer. Preferred solvents are water, tetrahydrofuran, 1,4-dioxane, 1,3-dioxolane, hexamethylphosphorotriamide, N-methylpyrrolidone, formamide, N,N-dimethylformamide, dimethyl sulfoxide, mixtures of water and isopropanol. Water is particularly preferred since in this case the reaction product is precipitated during the reaction. The end product is soluble in many organic solvents. In this case, the polymer solution is introduced into a nonsolvent for the polymer while stirring, in order to isolate the product in solid form, and the latter is filtered off. Suitable nonsolvents for the polymer are nonpolar solvents or water. Another procedure which is likewise feasible is to add the nonsolvent for the polymer to the synthesis solution while stirring. In both cases, thorough mixing is essential in order to obtain a reaction product which can be readily handled and to separate off the concomitantly formed byproducts as quantitatively as possible. The precipitated reaction product is separated off, washed with water and then dried.

The concentration of the reactants, based on the amount of solvent, is preferably from 3 to 25% by weight, particularly preferably from 7 to 16% by weight. The catalytic amount of added acid is preferably from 1 to 15% by weight, based on the product used. This amount of mineral acid can, but need not, be neutralized after the end of the reaction by adding molar amounts of an alkaline compound in order to prevent an acid-catalyzed deacetalation of the polymeric binders during storage or subsequent use. Suitable alkaline compounds are alkaline earth and alkali carbonates and hydroxides as well as ammonia. Sodium hydroxide and potassium hydroxide are preferred.

The second essential component of the photosensitive composition according to the invention is a diazonium polycondensate or a system capable of free radical polymerization and comprising photoinitiators and unsaturated compounds which are capable of free radical polymerization or a hybrid system comprising a diazonium polycondensate and a system capable of free radical polymerization and comprising photoinitiators and unsaturated compounds which are capable of free radical polymerization.

The diazonium polycondensate used in the photosensitive mixtures according to the invention may be any diazonium polycondensates known to a person skilled in the art. Such condensates can be prepared, for example, in a conventional manner by condensation of a diazo monomer described in EP-A-0 104 863 with a condensing agent, such as formaldehyde, acetaldehyde, propionaldehyde, butyraldehyde, isobutyraldehyde or benzaldehyde. Furthermore, cocondensates which, in addition to the diazonium salt units, also contain other, nonphotosensitive units which are derived from condensable compounds, in particular aromatic amines, phenols, phenol ethers, aromatic thioethers, aromatic hydrocarbons, aromatic heterocycles and organic amides, are used. Particularly advantageous examples of the diazonium polycondensates are reaction products of diphenylamine-4-diazonium salts, which optionally contain a methoxy group in the phenyl radical carrying the diazo group, with formaldehyde or 4,4'-bismethoxymethyldiphenyl ether. Suitable anions of these diazo resins are in particular aromatic sulfonates, such as 4-tolylsulfonate or mesitylene sulfonate, tetrafluoroborate, hexafluoroantimonate, hexafluoroarsenate or hexafluorophosphate. The diazonium polycondensate is preferably present in the photosensitive mixtures in an amount of from 3 to 60% by weight.

The correct composition of the polymer according to the invention necessitates optimization experiments for the respective intended use. For example, the developability, the photosensitivity, the acceptance for inks, the stability during storage under high atmospheric humidity and temperature are determined as a function of the composition of the polymer in the manner known to a person skilled in the art.

The second essential component may also be a system capable of free radical polymerization. This is composed of photoinitiators which absorb in the range from 300 to 800 nm, preferably from 300 to 450 nm, and components capable of free radical polymerization. Suitable photoinitiators for the photosensitive compositions according to the invention are preferably the parent structures or derivatives of acetophenone, benzophenone, 2,4-(trichloromethyl)-1,3, 5-triazine, benzoin, benzoin ethers, benzoin ketals, xanthone, thioxanthone, acridine or hexarylbisimidazole. That component of the mixture according to the invention which is capable of free radical polymerization is an acrylic or methacrylic acid derivative having one or more unsaturated groups, preferably esters of acrylic or methacrylic acid in the form of monomers, oligomers or prepolymers. It may be present in solid or liquid form, solid and viscous forms being preferred. The compounds which are suitable as monomers include, for example, trimethylolpropane triacrylate and methacrylate, pentaerythritol triacrylate and methacrylate, dipentaerythritol monohydroxypentaacrylate and methacrylate, dipentaerythritol hexaacrylate and methacrylate, pentaerythritol tetraacrylate and methacrylate, ditrimethylolpropane tetraacrylate and methacrylate, diethylene glycol diacrylate and methacrylate, triethylene glycol diacrylate and methacrylate or tetraethylene glycol diacrylate and methacrylate. Suitable oligomers or prepolymers are urethane acrylates and methacrylates, epoxide acrylates and methacrylates, polyester acrylates and methacrylates, polyether acrylates and methacrylates or unsaturated polyester resins. The photoinitiators and components capable of free radical polymerization should have a composition known to a person skilled in the art, combinations of different photoinitiators and different components capable of free radical polymerization also being advantageous. The amount by weight of the photoinitiators is preferably from 0.5 to 20% by weight and that of the components capable of free radical polymerization is from 5 to 80% by weight, based on the total solids content of the photosensitive compositions.

A combination of the diazonium polycondensates with a system capable of free radical polymerization and comprising photoinitiators and unsaturated compounds which are capable of free radical polymerization may have advantages for specific applications. Such hybrid systems preferably comprise from 1 to 50% by weight of diazonium polycondensate, from 0.5 to 20% by weight of photoinitiators and from 5 to 80% by weight of the components capable of free radical polymerization.

The exposure indicators which can be used in the photosensitive compositions according to the invention are known to a person skilled in the art. Exposure indicators from the series consisting of the triarylmethane dyes (such as Victoria Sky Blue BO, Victoria Blue R, Crystal Violet) or azo dyes (such as 4-phenylazo-diphenylamine, azobenzene or 4-N,N-dimethylaminoazobenzene) are preferred. The exposure indicators are present in the photosensitive composition in an amount of from 0.02 to 10% by weight, preferably from 0.5 to 6% by weight.

Suitable colorants for increasing the image contrast are those which are readily soluble in the solvent or solvent mixture used for coating or which can be introduced in disperse form as a pigment. The suitable contrast colorants include Rhodamine dyes, methyl violet, anthraquinone pigments and phthalocyanine dyes and pigments. The colorants are contained in the photosensitive composition in an amount of from 1 to 15% by weight, preferably from 2 to 7% by weight.

Furthermore, the composition according to the invention may contain stabilizer acids. Such stabilizing acids include phosphoric, citric, benzoic, m-nitrobenzoic, p-anilinoazobenzenesulfonic, p-toluenesulfonic and/or tartaric acid. A mixture of a plurality of different acids is advantageous in some formulations. Phosphoric acid is preferably used as a stabilizing acid. The amount of the added acid is preferably from 0.2 to 3% by weight in the photosensitive composition.

The photosensitive composition according to the invention may furthermore contain a plasticizer. Preferred plasticizers include dibutyl phthalate, triaryl phosphate and dioctyl phthalate. The amounts of plasticizer used are preferably from 0.25 to 2% by weight in the photosensitive composition.

The photosensitive compositions according to the invention can preferably be used for the production of printing plates. Furthermore, however, they can also be used in recording materials for the production of images on suitable substrates and receiving sheets, for the production of reliefs which can be used as a printing plate, screens and the like, as photocurable finishes for surface protection and for the formulation of UV-curable printing inks.

For the production of lithographic printing plates, aluminum, as a substrate, is first roughened by brushing in the dry state, by brushing with suspensions of abrasives or by an electrochemical method, for example in a hydrochloric acid electrolyte. The plates which have been roughened and, optionally, anodically oxidized in sulfuric or phosphoric acid are then subjected to a hydrophilizing after treatment, preferably in aqueous solutions of polyvinylphosphonic acid, sodium silicate or phosphoric acid. The details of the above-mentioned substrate pretreatment are sufficiently well known to a person skilled in the art.

The subsequently dried substrates are coated with the photosensitive compositions from organic solvents or solvent mixtures so that dry layer weights preferably in the range from 0.5 to 4 g/m$^2$, particularly preferably from 0.8 to 3 g/m$^2$, are obtained. In some cases, the additional application of a top oxygen barrier layer to the photosensitive layer may be advantageous. This is particularly advantageous in the case of systems capable of free radical polymerization and in the case of the hybrid systems comprising diazonium polycondensate and systems capable of free radical polymerization. The polymers suitable for the top layer include polyvinyl alcohol, polyvinyl alcohol/polyvinyl acetate copolymers, polyvinylpyrrolidone, polyvinylpyrrolidone/polyvinyl acetate copolymers, polyvinyl methyl ether, polyacrylic acid and gelatin. The thicknesses of the top oxygen barrier layer are preferably from 0.1 to 4 g/m$^2$ and particularly preferably from 0.3 to 2 g/m$^2$.

The printing plates thus produced are exposed and developed in the manner known to a person skilled in the art. The developed plates are usually treated with a preservative ("gumming"). The preservatives comprise aqueous solutions of hydrophilic polymers, wetting agents and further additives.

It is furthermore advantageous to increase the mechanical strength of the printing layers by a heat treatment or combined use of heat and UV light for specific applications. For this purpose, before this treatment the developed plate is first treated with a solution which protects the non-image parts so that the heat treatment does not cause these parts to accept ink. A suitable solution for this purpose is described, for example, in U.S. Pat. No. 4,355,096.

The invention is explained in more detail below with reference to embodiments, but without being restricted thereby.

PREPARATION EXAMPLE 1

576 g (12.33 mol) of a copolymer of 93 mol % of vinyl alcohol, 5 mol % of vinyl acetate and 2 mol % of acrylic acid, which copolymer, as a 4% strength solution, has a viscosity of 11.0 mPas at 20° C., is dissolved in 6,624 g of demineralized water at 95° C. in the course of 30 minutes and then filtered at room temperature by means of a 5 μm filter. Butyraldehyde(163.61 g (98.7%); 2.24 mol) and acetaldehyde (99.14 g (99.5%); 2.24 mol) are added to the polyvinyl alcohol solution. Optionally, an oxidation stabilizer, such as, for example, 2,6-di-tert-butyl-4-methylphenol (Ralox® BHT from Raschig) can be added.

The reaction mixture is cooled to 10° C. and hydrochloric acid (1 190 ml, 20% strength) is metered in over a period of 180 minutes at this temperature. In the course of 120 minutes, heating is effected to an internal temperature of 40° C. and this temperature is maintained for 2 hours. The solid reaction product is filtered off and is washed sufficiently with demineralized water. It is then adjusted to pH 12 with sodium hydroxide solution (10% strength). About 200 ml of alkali are required for this purpose. Thereafter, heating is effected to an internal temperature of 55° C. and a sample is taken after 30 minutes. If the product is alkaline, the after treatment is terminated. Drying is then carried out in an oven or fluidized-bed drier. Weight obtained: 659 g (solids content 97.3%), corresponding to >97.5% of theory. The viscosity in ethanol (5%, Höppler DIN 53015) is 27 mPas. The glass transition temperature according to DSC analysis is 98° C. (DIN 53765).

PREPARATION EXAMPLE 2

504 g (10.8 mol) of a copolymer of 93 mol % of vinyl alcohol, 5 mol % of vinyl acetate and 2 mol % of acrylic acid, which copolymer, as a 4% strength solution, has a viscosity of 11.0 mPas at 20° C., is dissolved in 6,696 g of demineralized water at 95° C. in the course of 30 minutes and then filtered at room temperature by means of a 5 μm filter. Butyraldehyde (286.4 g (98.7%); 3.92 mol) is added to the polyvinyl alcohol solution. Optionally, an oxidation stabilizer, such as, for example, 2,6-di-tert-butyl-4-methylphenol (Ralox® BHT from Raschig) can be added.

The reaction mixture is cooled to 10° C. and hydrochloric acid (1,189 ml, 20% strength) is metered in over a period of 180 minutes at this temperature. In the course of 120 minutes, heating is effected to an internal temperature of 40° C. and this temperature is maintained for 2 hours. The solid reaction product is filtered off and is washed sufficiently with demineralized water. It is then adjusted to pH>12 with sodium hydroxide solution (10% strength). About 200 ml of alkali are required for this purpose. Thereafter, heating is effected to an internal temperature of 55° C. and a sample is taken after 30 minutes. If the product is alkaline, the after treatment is terminated. Drying is then carried out in an oven or fluidized-bed drier. Weight obtained: 626 g (solids content 98.9%), corresponding to 87% of theory. The viscosity in ethanol (10%, Höppler DIN 53015) is 128 mPas. The glass transition temperature according to DSC analysis is 81° C. (DIN 53765).

PREPARATION EXAMPLE 3

576 g (12.33 mol) of a copolymer of 93 mol % of vinyl alcohol, 5 mol % of vinyl acetate and 2 mol % of acrylic acid, which copolymer, as a 4% strength solution, has a viscosity of 11.0 mPas at 20° C., is dissolved in 6,624 g of demineralized water at 95° C. in the course of 30 minutes and then filtered at room temperature by means of a 5 μm filter. Butyraldehyde (229.04 g (98.7%); 3.14 mol) and acetaldehyde (59.64 g (99.5%); 1.35 mol) are added to the polyvinyl alcohol solution. Optionally, an oxidation stabilizer, such as, for example, 2,6-di-tert-butyl-4-methylphenol (Ralox® BHT from Raschig) can be added.

The reaction mixture is cooled to 10° C. and hydrochloric acid (806 ml, 20% strength) is metered in over a period of 180 minutes at this temperature. In the course of 120 minutes, heating is effected to an internal temperature of 40° C. and this temperature is maintained for 2 hours. The solid reaction product is filtered off and is washed sufficiently with demineralized water. It is then adjusted to pH 7 to 8 with sodium hydroxide solution (10% strength). About 150 ml of alkali are required for this purpose. Thereafter, heating is effected to an internal temperature of 55° C. and a sample is taken after 30 minutes. If the product is alkaline, the after treatment is terminated. The solid products separated off, washed and then dried in an oven or fluidized-bed drier. Weight obtained: 639 g; corresponding to 93% of theory. The viscosity in ethanol (5%, Höppler DIN 53015) is 26.4 mPas. The glass transition temperature according to DSC analysis is 91° C. (DIN 53765).

PREPARATION EXAMPLE 4

3,200 g (68.6 mol) of a copolymer of 93 mol % of vinyl alcohol, 5 mol % of vinyl acetate and 2 mol % of acrylic acid, which copolymer, as a 4% strength solution, has a viscosity of 11.0 mPas at 20° C., are dissolved in 36.8 l of demineralized water at 95° C. in the course of 30 minutes and then filtered at room temperature by means of a 5 μm filter. Butyraldehyde (1,210.9 g (98.6%); 16.56 mol) and acetaldehyde 314.7 g (99.5%); 7.1 mol) are added to the polyvinyl alcohol solution. Optionally, an oxidation stabilizer, such as, for example, 2,6-di-tert-butyl-4-methylphenol (Ralox® BHT from Raschig) can be added.

The reaction mixture is cooled to 8° C., and hydrochloric acid (6,278 ml, 20% strength) cooled to 5° C. is metered in at this temperature over a period of 180 minutes. In the course of 120 minutes, heating is effected to an internal temperature of 40° C. and this temperature is maintained for 2 hours. The solid reaction product is filtered off and is washed sufficiently with demineralized water. It is then adjusted to pH 6.5 to 7 with sodium hydroxide solution (10% strength). About 500 ml of alkali are required for this purpose. Heating is then effected to an internal temperature of 30° C. and this temperature is maintained for 300 minutes. The product filtered off is washed with demineralized water and then dried in an oven or fluidized-bed drier. Weight obtained: 3 995 g (solids content 97.16%), corresponding to 93% of theory. The viscosity in ethanol (5%, Höppler DIN 53015) is 21.3 mPas. The glass transition temperature according to DSC analysis is 89° C. (DIN 53765).

PREPARATION EXAMPLES 5 and 6

29 g of a copolymer of 93 mol % of vinyl alcohol, 5 mol % of vinyl acetate and 2 mol % of acrylic acid, which copolymer, as a 4% strength aqueous solution, has a viscosity of 11.0 mPas at 20° C., is dissolved in 260 ml of DMSO. 3 ml of 37% strength hydrochloric acid and the amounts, corresponding to the compositions in Table 1, of acetaldehyde and butyraldehyde are added to this mixture. The mixture is stirred for 8 hours at 30° C. and the acetal polymers are precipitated by slow dropwise addition of DMSO solution in water. The polymer is filtered off and is dried in a forced-circulation drier for 24 hours at 40° C.

TABLE 1

Composition of the acetal binders according to the preparation examples 1 to 6

| Preparation Expl. No. | Vinyl alcohol mol % | Vinyl acetal mol % | Vinyl butyral mol % | Vinyl acetate mol % | Acrylic acid mol % | Acid number [mg KOH/ 1 g] |
|---|---|---|---|---|---|---|
| 1 | 30.1 | 29.4 | 29.4 | 7.9 | 3.2 | 17.2 |
| 2 | 30.1 | — | 58.8 | 7.9 | 3.2 | 17.7 |
| 3 | 30.1 | 17.7 | 41.1 | 7.9 | 3.2 | 16.9 |
| 4 | 35.9 | 16.0 | 30.3 | 7.7 | 3.1 | 16.3 |
| 5 | 36.4 | 15.8 | 37.0 | 7.7 | 3.1 | 16.3 |
| 6 | 52.1 | 11.4 | 26.8 | 6.9 | 2.8 | 18.5 |

PREPARATION EXAMPLE 7

Comparative Example Based on WO 93/03068

A mixture of 25 g of polyvinyl alcohol (Mowiol® 5/88 from Clariant GmbH having a residual acetyl group content of about 21% by weight), 75 ml of water and 150 ml of n-propanol is stirred at 70° C. for 20 hours. The solution is cooled to 60° C. After the addition of 3.4 g of concentrated hydrochloric acid, first a mixture of 5.4 g of benzaldehyde, 7.4 g of butyraldehyde and then 9 g of phthalaldehydic acid are added in the course of 2 hours. Stirring is carried out for 2 hours at 60° C. and sodium carbonate is added in an amount such that a pH of 7 is obtained. By precipitation in water, washing of the polymer with water and drying for 24 hours at 40° C., a product having an acid number of mg KOH per gram of polymer is obtained.

PREPARATION EXAMPLE 8

Comparative Example Basd on DE-A-20 533 63

50 g of polyvinyl butyral (Mowital® B60T from Clariant GmbH having an acetal content of 70% by weight, a vinyl alcohol content of 26% by weight and an acetate content of 3% by weight) are dissolved in 752 g of dried 1,4-dioxane at 40° C. 27.2 g of p-toluenesulfonyl isocyanate are then added dropwise at the same temperature in the course of 20 minutes. Stirring is carried out for a further 4 hours at 40° C. and the polymer is precipitated in an excess of water. After thorough washing with water, the product is filtered off with suction and is dried in a forced-circulation drier at 40° C. for 24 hours.

PREPARATION EXAMPLE 9

Comparative Example Based on EP-A-0 152 819

25 g of polyvinyl butyral (Mowital® B60T from Clariant GmbH having an acetal content of 70% by weight, a vinyl alcohol content of 26% by weight and an acetate content of 3% by weight) are dissolved in 700 ml of methyl ethyl ketone at 60° C. and then refluxed for 6 hours after the addition of 10 g of maleic anhydride and 0.7 ml of triethylamine. By precipitation in water, washing of the polymer with water and drying for 24 hours at 40° C., a product having an acid number of 58 mg KOH per gram of polymer is obtained.

PREPARATION EXAMPLE 10

Comparative Example Based on GB-A-1 396 355

100 g of a copolymer comprising 6 mol % of crotonic acid and 94 mol % of vinyl acetate are dissolved in 1 000 ml of methanol. A solution of 2 g of sodium dissolved in 40 ml of methanol is added thereto and refluxing is carried out for 30 minutes. The precipitated product is filtered off with suction and is dried at 40° C. for 24 hours in a forced-circulation drier.

25 g of the polymer thus prepared are dissolved in 100 ml of water. 1.7 ml of concentrated sulfuric acid, which has been diluted before hand with 7 ml of water, and 10.7 g of 4-chlorobenzaldehyde and 35 ml of ethylene glycol monomethyl ether are then added and refluxing is carried out for 90 minutes. The polymer formed is filtered off with suction, washed with water and dried for 24 hours at 40° C. in a forced-circulation drier. The acid number determination gave a value of 9.8 mg KOH/1 g of polymer.

EXAMPLES 1 TO 6

Coating solutions containing the binders of preparation examples 1 to 6 are prepared from the following components:

2.19 g of binder according to preparation examples 1 to 6
2 g of polycondensate of 1 mol of 3-methoxydiphenylamine-4-diazonium sulfate and 1 mol of 4,4'-bismethoxymethyldiphenyl ether, precipitated as mesitylene sulfonate
5.55 g of a 13.8% by weight dispersion in propylene glycol monomethyl ether, whose solids content comprises 1 part of the binder according to preparation examples 1 to 6 and 1 part of Irgalith Blue GLG (copper phthalocyanine C.I. 15:3, from Ciba)
0.025 g of 4-phenylazodiphenylamine
0.035 g of phosphoric acid.

Said components are dissolved, while stirring, in a mixture comprising
5.5 ml of ethylene glycol monomethyl ether,
45 ml of methanol and
25 ml of methyl ethyl ketone.

After filtration of the solution, it is applied by conventional methods to an electrochemically roughened and anodized aluminum foil which has been after treated with polyvinylphosphonic acid, and the layer is dried for 4 minutes at 90° C. The weight of the copying layer is about 1 g/m².

The copying layer is exposed under a silver film half tone scale having a density range of from 0.15 to 1.95, the density increments being 0.15, in the form of a photographic negative, to a metal halide lamp (MH burner, from W. Sack) at 300 mJ/cm².

The exposed layer is treated with a developer solution comprising
3.4 parts by weight of Rewopol® NLS 28 (30% strength solution of sodium laurylsulfate in water, from Rewo)
1.8 parts by weight of 2-phenoxyethanol
1.1 parts by weight of diethanolamine
1.0 part by weight of Texapon® 842 (42% strength solution of octyl sulfate in water, from Henkel)
0.6 part by weight of Nekal® BX Paste (sodium salt of an alkylnaphthalenesulfonic acid from BASF)
0.2 part by weight of 4-toluenesulfonic acid
91.9 parts by weight of water
for 30 seconds. Thereafter, the developer solution was rubbed on the surface for a further 30 seconds by means of a pad, and the entire plate was then washed off with water. After this treatment, the exposed parts remain on the plate. In order to evaluate the photosensitivity and the ink acceptance, the plate is blackened in the wet state by a printing ink. The products PC 904® (from Polychrome) and RC 43® (from Hoechst) are used.

The ink acceptance of the plates with the binders of preparation examples 1 to 6 is good with both printing inks, and microlines produced by exposure are very well reproduced. The following gray scale values were read:

| Preparation Example 1: | 4 full steps | 8 partially covered steps |
| Preparation Example 2: | 4 full steps | 6 partially covered steps |
| Preparation Example 3: | 4 full steps | 8 partially covered steps |
| Preparation Example 4: | 4 full steps | 7 partially covered steps |
| Preparation Example 5: | 4 full steps | 7 partially covered steps |
| Preparation Example 6: | 4 full steps | 6 partially covered steps |

For the preparation of a printing plate, as stated above, a copying layer is applied to the aluminum foil, exposed and developed, and the developed plate is treated with a doctor blade after rinsing with water and is rubbed with an aqueous solution of 0.5% strength phosphoric acid and 6% strength gum arabic. The plate thus produced is clamped in a sheet-fed offset printing press and gives 180,000 copies of good quality under normal printing conditions. Further printing could be carried out using the plate.

EXAMPLE 7

A coating solution is prepared from the following components:

5.2 g of polymer according to preparation example 1
2.8 g of an 80% strength solution of a urethane acrylate in methyl ethyl ketone, prepared by reacting 1-methyl-2,4-bisisocyanatobenzene (Desmodur® N100 from Bayer) with hydroxyethyl acrylate and pentaerythritol triacrylate, having a double bond content of 0.50 double bond/100 g with complete conversion of the isocyanate groups
1.4 g of dipentaerythritol pentaacrylate
0.17 g of 2-(4-methoxynaphth-1-yl)-4,6-bis(trichloromethyl)-s-triazine
0.3 g of polycondensate of 1 mol of 3-methoxydiphenylamine-4-diazonium sulfate and 1 mol of 4,4'-bismethoxymethyldiphenyl ether, precipitated as mesitylene sulfonate
0.2 g of Victoria Sky Blue BO
0.1 g of phosphoric acid (85% strength)

Said components are dissolved, while stirring, in 100 ml of a mixture comprising
30 parts by volume of ethylene glycol monomethyl ether
45 parts by volume of methanol
25 parts by volume of methyl ethyl ketone.

After filtration of the solution, it is applied by conventional methods to an electrochemically roughened and anodized aluminum foil which has been after treated with an aqueous solution of polyvinylphosphonic acid, and the layer is dried for 4 minutes at 90° C. The weight of the copying layer is about 1 g/m².

An oxygen barrier layer having a dry layer weight of 0.4 g/m² is then applied in an analogous manner by coating with a solution having the following composition:

50 g of polyvinyl alcohol (Airvol® 203 from Air Products; 12% by weight of residual acetyl groups)

170 g of water

Drying is effected for 5 minutes at 95° C.

The plate is exposed, developed, blackened and printed in a manner described in example 1. The ink acceptance of the plate is good and microlines produced by exposure are very well reproduced. The 4th step of the gray scale is completely covered and the steps to 10 are partially covered.

The plate thus produced is clamped in a sheet-fed offset printing press and gives 100 000 copies of good quality under normal printing conditions. Further printing could be carried out using the plate.

EXAMPLE 8

A coating solution is prepared from the following components:

3.3 g of polymer according to preparation example 4

4.7 g of an 80% strength solution of a urethane acrylate prepared by reacting 1-methyl-2,4-bisisocyanatobenzene (Desmodur® N100 from Bayer) with hydroxyethyl acrylate and pentaerythritol triacrylate, having a double bond content of 0.5 double bond/100 g with complete conversion of the isocyanate groups 0.17 g of 2-(4-methoxynaphth-1-yl)-4,6-bis(trichloromethyl)-1,3,5-triazine 0.16 g of 4,4'-N,N-diethylaminobenzophenone 0.19 g of 3-mercapto-1,2,4-triazole 0.12 g of Congo red 0.2 g of leuco crystal violet The said components are dissolved, while stirring, in 100 ml of a mixture comprising 35 parts by volume of ethylene glycol monomethyl ether 25 parts by volume of methanol 40 parts by volume of methyl ethyl ketone.

After filtration of the solution, it is applied by conventional methods to an electrochemically roughened and anodized aluminum foil which has been after 10 treated with an aqueous solution of polyvinylphosphonic acid, and the layer is dried for 4 minutes at 90° C. The weight of the copying layer is about 2.0 g/m².

An oxygen barrier layer having a dry layer weight of 1.8 g/m² is then applied in an analogous manner by coating with a solution of the following composition:

50 g of polyvinyl alcohol (Airvol® 203 from Air Products; containing 12% by weight of residual acetyl groups)

270 g of water

Drying is effected for 5 minutes at 90° C.

The plate is exposed in the manner described in example 1, but to a quantity of 20 mJ/m² of light. Immediately after the exposure, the plate is heated for 1 minute at 95° C. to intensify the photopolymerization taking place. The development and blackening are effected in the manner described in example 1.

The drop test for the copying layer is 10 seconds for both cases. The ink acceptance of the plate is good. The second step of the gray scale is completely covered and the steps to 6 are partially covered.

The plate thus produced is clamped in a sheet-fed offset printing press and gives 100 000 copies of good quality under normal printing conditions. Further printing could be carried out using the plate.

Comparative Example 1

A coating solution is prepared from the following components:

4.38 g of polyvinyl butyral which has an average molecular weight of 30,000 and contains 70% by weight of butyral units, 27% by weight of vinyl alcohol units and 3% by weight of vinyl acetate units 4 g of polycondensate of 1 mol of 3-methoxydiphenylamine-4-diazonium sulfate and 1 mol of 4,4'-bismethoxymethyldiphenyl ether, precipitated as mesitylene sulfonate 1.5 g of Renol® blue B2G-HW (from Clariant GmbH: copper phthalocyanine pigment dispersed in polyvinyl butyral)

0.05 g of 4-phenylazodiphenylamine 0.07 g of phosphoric acid

Said components are dissolved, while stirring, in 200 ml of a mixture comprising 30 parts by volume of ethylene glycol monomethyl ether 45 parts by volume of methanol 25 parts by volume of methyl ethyl ketone.

After filtration of the solution, it is applied by conventional methods to an electrochemically roughened and anodized aluminum foil which has been after treated with an aqueous solution of polyvinylphosphonic acid, and the layer is dried for 4 minutes at 90° C. The weight of the copying layer is about 1 g/m².

The plate is exposed, developed and blackened in the manner described in example 1.

The plates thus produced prove to be very difficult to develop. Unexposed parts can be freed from adhering layer residues only by means of strong mechanical support. The unexposed parts of the layer are in some cases insoluble in the developer and tend to form deposits on the plate and in the machines used for the development. The resolution is poor since the spaces between fine details are not cleanly developed.

Comparative Example 2

A coating solution is prepared from the following components:

6.38 g of polymer corresponding to preparation example 7

2 g of polycondensate of 1 mol of 3-methoxydiphenylamine-4-diazonium sulfate and 1 mol of 4,4'-bismethoxymethyldiphenyl ether, precipitated as mesitylene sulfonate 1.5 g of Renol® blue B2G-HW (from Clariant GmbH: copper phthalocyanine pigment dispersed in polyvinyl butyral)

0.05 g of 4-phenylazodiphenylamine 0.07 g of phosphoric acid

Said components are dissolved, while stirring, in 200 ml of a mixture comprising 30 parts by volume of ethylene glycol monomethyl ether 45 parts by volume of methanol 25 parts by volume of methyl ethyl ketone.

After filtration of the solution, it is applied by conventional methods to an electrochemically roughened and anodized aluminum foil which has been after treated with an aqueous solution of polyvinylphosphonic acid, and the layer is dried for 4 minutes at 90° C. The weight of the copying layer is about 1 g/m².

The plate is exposed, developed and blackened in the manner described in example 1.

The ink acceptance of the plate is poorer than in the case of the printing plates produced according to the invention. The first 2 steps of the gray scale are completely covered and the steps to 8 are partially covered.

The plate thus produced is clamped in a sheet-fed offset printing press and, after 100,000 copies under normal printing conditions, exhibits considerable losses of microelements and signs of wear start to become visible in the solid areas.

Comparative Example 3

A coating solution is prepared from the following components:

6.38 g of polymer according to preparation example 8

2 g of polycondensate of 1 mol of 3-methoxydiphenylamine-4-diazonium sulfate and 1 mol of 4,4'-bismethoxymethyldiphenyl ether, precipitated as mesitylene sulfonate 1.5 g of Renol® blue B2G-HW (from Clariant GmbH; copper phthalocyanine dispersed in polyvinyl butyral)

0.05 g of 4-phenylazodiphenylamine 0.07 g of phosphoric acid

Said components are dissolved, while stirring, in 200 ml of a mixture comprising 30 parts by volume of ethylene glycol monomethyl ether 45 parts by volume of methanol 25 parts by volume of methyl ethyl ketone.

After filtration of the solution, it is applied by conventional methods to an electrochemically roughened and anodized aluminum foil which has been after treated with an aqueous solution of polyvinylphosphonic acid, and the layer is dried for 4 minutes at 90° C. The weight of the copying layer is about 1 g/m².

The plate is exposed, developed, blackened and printed in the manner described in example 1.

The ink acceptance of the plate is poorer than in the case of the printing plates produced according to the invention. The first 2 steps of the gray scale are completely covered and the steps to 8 partially covered. The plate thus produced is clamped in a sheet-fed offset printing press and, after 100 000 copies under normal printing conditions, exhibits considerable losses of microelements and incipient signs of wear in the solid areas.

Comparative Example 4

A coating solution is prepared from the following components:

5.85 g of polymer according to preparation example 9

3 g of polycondensate of 1 mol of 3-methoxydiphenylamine-4-diazonium sulfate and 1 mol of 4,4'-bismethoxymethyldiphenyl ether, precipitated as mesitylene sulfonate 1 g of Renol® blue B2G-HW (from Clariant GmbH; copper phthalocyanine dispersed in polyvinyl butyral)

0.05 g of 4-phenylazodiphenylamine 0.1 g of phosphoric acid

Said components are dissolved, while stirring, in 200 ml of a mixture comprising 30 parts by volume of ethylene glycol monomethyl ether 45 parts by volume of methanol 25 parts by volume of methyl ethyl ketone.

After filtration of the solution, it is applied by conventional methods to an electrochemically roughened and anodized aluminum foil which has been after treated with an aqueous solution of polyvinylphosphonic acid, and the layer is dried for 4 minutes at 90° C. The weight of the copying layer is about 1 g/m².

The plate is exposed, developed, blackened and printed in the manner described in example 1.

The reproduction of fine dots is adequate. The first step of the gray scale is completely covered and the steps to 7 are partially covered.

In contrast, the polymers prepared according to the invention have a higher sensitivity.

Comparative Example 5

2.19 g of binder according to preparation example 10

2 g of polycondensate of 1 mol of 3-methoxydiphenylamine-4-diazonium sulfate and 1 mol of 4,4'-bismethoxymethyldiphenyl ether, precipitated as mesitylene sulfonate 5.55 g of a 13.8% by weight dispersion in propylene glycol monomethyl ether, whose solids content comprises 1 part of the binder according to preparation example 10 and 1 part of Irgalith Blue GLG (copper phthalocyanine C.I. 15:3, from Ciba)

0.025 g of 4-phenylazodiphenylamine 0.035 g of phosphoric acid

Said components are dissolved, while stirring, in a mixture comprising 5.5 ml of ethylene glycol monomethyl ether, 45 ml of methanol and 25 ml of methyl ethyl ketone.

After filtration of the solution, it is applied by conventional methods to an electrochemically roughened and anodized aluminum foil which has been aftertreated with polyvinylphosphonic acid, and the layer is dried for 4 minutes at 90° C. The weight of the copying layer is about 1 g/m².

The plate is exposed, developed and blackened in the manner described in example 1.

The plate proves to be very slowly developable. The first 2 steps of the gray scale are completely covered and the steps to 5 are partially covered.

The plate thus produced is clamped in a sheet-fed offset printing press and, after 100 000 copies under normal printing conditions, shows considerable losses of microelements, and signs of wear start to become visible in the solid areas.

The results of the comparative examples show that the printing plates comprising the binders prepared according to the invention have significantly better performance characteristics.

What is claimed is:

1. A photosensitive composition comprising:
(i) at least one diazonium polycondensate, at least one system capable of free radical polymerization and comprising photoimtiators and unsaturated compounds which are capable of free radical polymerization or at least one hybrid system comprising a diazonium polycondensate and a system capable of free radical polymerization and comprising photoinitiators and unsaturated compounds which are capable of free radical polymerization, and (ii) at least one binder comprising units A, B, C and D, A being present in an amount of from 0.1 to 25 mol % and corresponding to the formula

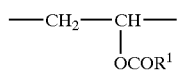

in which $R^1$ is a hydrogen atom, an aliphatic hydrocarbon radical having 1 to 4 carbon atoms which may be unsubstituted or substituted with at least one carboxyl group, sulfonic acid group, hydroxyl group or at least one halogen atom, or an aromatic radical which may be unsubstituted or substituted with at least one alkyl group, carboxyl group, sulfonic acid group, hydroxyl group or at least one halogen atom, preferably a methyl group, B being present in an amount of from 0.1 to 60 mol % and

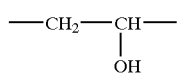

C being present in an amount of from 10 to 80 mol % and corresponding to the formula

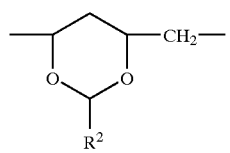

in which $R^2$ is a hydrogen atom, an alkyl radical having from 1 to 10 carbon atoms which may be unsubstituted or substituted with at least one carboxyl group, sulfonic acid group, hydroxyl group or at least one halogen atom, or an aryl radical which may be unsubstituted or substituted with at least one alkyl group, carboxyl group, sulfonic acid group, hydroxyl group or at least one halogen atom, it being possible for this unit to be present several times with different radicals $R^2$ independently of one another, and D being present in an amount of from 1 to 20 mol % and corresponding to the formula

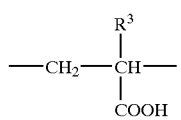

in which $R^3$ is a hydrogen atom or alkyl radical having 1 to 10 carbon atoms, which may be unsubstituted or substituted by a carboxyl group.

2. The composition as claimed in claim 1, wherein the diazonium polycondensate is formed from 3-methoxydiphenylamine-4-diazonium sulfate and 4,4'-bismethoxymethyldiphenyl ether precipitated from an aqueous solution as an organic sulfonate, tetrafluoroborate, hexafluorophosphate, hexafluoroantimonate or hexafluoroarsenate.

3. The composition as claimed in claim 1, wherein the system is a free radical generating photoinitiator, or mixtures of photoinitiators and coinitiators, which sensitize the composition for the wavelength range from 300 to 800 nm, and components capable of free radical polymerization and having unsaturated groups.

4. The composition as claimed in claim 1, wherein the hybrid system is a diazonium polycondensate formed from 3-methoxydiphenylamine-4-diazonium sulfate and 4,4'-bismethoxymethyldiphenyl in combination with a free radical photoinitiator system and components capable of free radical polymerization.

5. The composition as claimed in claim 1 further comprising one or more exposure indicators, one or more dyes for increasing the image contrast and one or more acids for stabilizing the photosensitive composition.

6. The composition as claimed in claim 1, wherein $R^1$ is a methyl group.

7. The composition as claimed in claim 1, wherein $R^2$ is a methyl, ethyl or propyl group.

8. The composition as claimed in claim 1, wherein $R^3$ is a hydrogen atom, a methyl group or a —$CH_2$—COOH group.

9. A process of forming a lithographic printing plate comprising the steps of:

a) imagewise exposing a photosensitive composition disposed on a substrate to radiation, wherein the photosensitive composition comprises:

(i) at least one diazonium polycondensate, at least one system capable of free radical polymerization and comprising photoinitiators and unsaturated compounds which are capable of free radical polymerization or at least one hybrid system comprising a diazonium polycondensate and a system capable of free radical polymerization and comprising photoinitiators and unsaturated compounds which are capable of free radical polymerization, and (ii) at least one binder comprising units A, B, C and D, A being present in an amount of from 0.1 to 25 mol % and corresponding to the formula

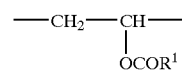

in which $R^1$ is a hydrogen atom, an aliphatic hydrocarbon radical having 1 to 4 carbon atoms which may be unsubstituted or substituted with at least one carboxyl group, sulfonic acid group, hydroxyl group or at least one halogen atom, or an aromatic radical which may be unsubstituted or substituted with at least one alkyl group, carboxyl group, sulfonic acid group, hydroxyl group or at least one halogen atom, preferably a methyl group, B being present in an amount of from 0.1 to 60 mol % and corresponding to the formula

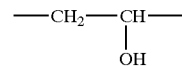

C being present in an amount of from 10 to 80 mol % and corresponding to the formula

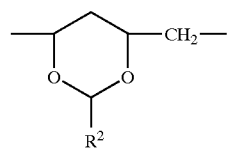

in which $R^2$ is hydrogen atom, an alkyl radical having from 1 to 10 carbon atoms which may be unsubstituted or substituted with at least one carboxyl group, sulfonic acid group, hydroxyl group or at least one halogen atom, or an aryl radical which may be unsubstituted or substituted with at least one alkyl group, carboxyl group, sulfonic acid group, hydroxyl group or at least one halogen atom, it being possible for this unit to be present several times with different radicals $R^2$ independently of one another, and D being present in an amount of from 1 to 20 mol % and corresponding to the formula

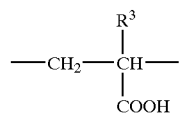

in which $R^3$ is a hydrogen atom or alkyl radical having 1 to 10 carbon atoms, which may be unsubstituted or substituted by a carboxyl group; and b) developing the photosensitive composition.

10. A printing plate coated with a photosensitive composition comprising:
   (i) at least one diazonium polycondensate, at least one system capable of free radical polymerization and comprising photoinitiators and unsaturated compounds which are capable of free radical polymerization or at least one hybrid system comprising a diazonium polycondensate and a system capable of free radical polymerization and comprising photoinitiators and unsaturated compounds which are capable of free radical polymerization, and
   (ii) at least one binder comprising units A, B, C and D, A being present in an amount of from 0.1 to 25 mol % and corresponding to the formula

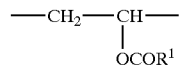

in which $R^1$ is a hydrogen atom, an aliphatic hydrocarbon radical having 1 to 4 carbon atoms which may be unsubstituted or substituted with at least one carboxyl group, sulfonic acid group, hydroxyl group or at least one halogen atom, or an aromatic radical which may be unsubstituted or substituted with at least one alkyl group, carboxyl group, sulfonic acid group, hydroxyl group or at least one halogen atom, preferably a methyl group, B being present in an amount of from 0.1 to 60 mol % and corresponding to the formula

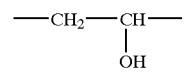

C being present in an amount of from 10 to 80 mol % and corresponding to the formula

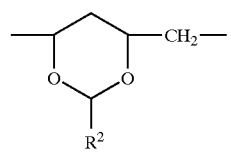

in which $R^2$ is a hydrogen atom, an alkyl radical having from 1 to 10 carbon atoms which may be unsubstituted or substituted with at least one carboxyl group, sulfonic acid group, hydroxyl group or at least one halogen atom, or an aryl radical which may be unsubstituted or substituted with at least one alkyl group, carboxyl group, sulfonic acid group, hydroxyl group or at least one halogen atom, it being possible for this unit to be present several times with different radicals $R^2$ independently of one another, and D being present in an amount of from 1 to 20 mol % and corresponding to the formula

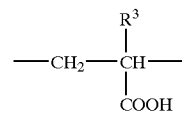

in which $R^3$ is a hydrogen atom or alkyl radical having 1 to 10 carbon atoms, which may be unsubstituted or substituted by a carboxyl group.

11. The printing plate of claim 10 wherein the unit B is present in an amount of from 20 to 55 mol %.

12. The process of claim 9 wherein the unit B is present in an amount of from 20 to 55 mol %.

13. The photosensitive composition of claim 1 wherein the unit B is present in an amount of from 20 to 55 mol %.

* * * * *

UNITED STATES PATENT AND TRADEMARK OFFICE
CERTIFICATE OF CORRECTION

PATENT NO. : 6,808,858 B2  
APPLICATION NO. : 10/221117  
DATED : October 26, 2004  
INVENTOR(S) : Robert Fuss et al.

It is certified that error appears in the above-identified patent and that said Letters Patent is hereby corrected as shown below:

<u>Title Page, Item 56, Foreign Patent Documents</u>

Delete "DE 23 38 025 C2" and insert --DE 28 38 025 C2--

<u>Claim 1, Column 16</u>

Line 62, delete "photoimitiators" and insert --photoinitiators--

<u>Claim 1, Column 17</u>

Line 17, from after "60 mol %" insert --and corresponding to the formula--

Signed and Sealed this

Eighth Day of January, 2008

JON W. DUDAS  
*Director of the United States Patent and Trademark Office*